(12) United States Patent
Niimi et al.

(10) Patent No.: US 9,842,933 B1
(45) Date of Patent: Dec. 12, 2017

(54) FORMATION OF BOTTOM JUNCTION IN VERTICAL FET DEVICES

(71) Applicant: GLOBALFOUNDRIES Inc., Grand Cayman (KY)

(72) Inventors: Hiroaki Niimi, Cohoes, NY (US); Kwan-Yong Lim, Niskayuna, NY (US); Steven John Bentley, Menands, NY (US); Daniel Chanemougame, Troy, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/180,422

(22) Filed: Jun. 13, 2016

(51) Int. Cl.
| | |
|---|---|
| *H01L 29/66* | (2006.01) |
| *H01L 29/786* | (2006.01) |
| *H01L 29/423* | (2006.01) |
| *H01L 21/306* | (2006.01) |
| *H01L 21/265* | (2006.01) |
| *H01L 27/24* | (2006.01) |
| *H01L 29/78* | (2006.01) |

(52) U.S. Cl.
CPC ...... *H01L 29/78618* (2013.01); *H01L 21/265* (2013.01); *H01L 21/30604* (2013.01); *H01L 27/2454* (2013.01); *H01L 29/42392* (2013.01); *H01L 29/66666* (2013.01); *H01L 29/78642* (2013.01); *H01L 2029/7858* (2013.01)

(58) Field of Classification Search
CPC ............. H01L 29/66795; H01L 29/785; H01L 29/7848; H01L 29/7851; H01L 21/02532; H01L 27/0886; H01L 29/66636; H01L 29/0847; H01L 21/823431; H01L 21/823821; H01L 27/0924; H01L 21/845; H01L 27/1211; H01L 29/78; H01L 29/72392; H01L 21/02381; H01L 29/41791; H01L 2029/7858; H01L 21/02293; H01L 27/10879; H01L 29/66477; H01L 29/6653; H01L 21/2253; H01L 29/78618; H01L 21/0245; H01L 27/2454; H01L 27/10826; H01L 2924/13067; H01L 29/7889; H01L 29/7926; H01L 29/8083; H01L 29/8122

See application file for complete search history.

(56) References Cited

U.S. PATENT DOCUMENTS

| | | | |
|---|---|---|---|
| 7,045,407 B2 * | 5/2006 | Keating | ............ H01L 21/30608 257/E21.223 |
| 9,299,721 B2 | 3/2016 | Liu et al. | |
| 9,530,869 B2 | 12/2016 | Akarvardar et al. | |
| 9,536,793 B1 | 1/2017 | Zhang et al. | |

(Continued)

*Primary Examiner* — Sonya D McCall Shepard
(74) *Attorney, Agent, or Firm* — Heslin Rothenberg Farley and Mesiti PC

(57) ABSTRACT

Formation of a bottom junction in vertical FET devices may include, for instance, providing an intermediate semiconductor structure comprising a semiconductor substrate, a fin disposed on the semiconductor substrate. The fin has a top surface, spaced-apart vertical sides. A mask is disposed over the top surface of the fin, and at least one is disposed over the vertical sides of the fin. Portions of the substrate are removed to define spaced-apart recesses each extending below a respective one of the spacers. Semiconductor material is grown, such as epitaxially grown, in the recesses.

14 Claims, 13 Drawing Sheets

(56) References Cited

U.S. PATENT DOCUMENTS

| | | | |
|---|---|---|---|
| 2011/0034020 A1* | 2/2011 | Johnson | H01L 21/3086 |
| | | | 438/595 |
| 2015/0255606 A1* | 9/2015 | Cheng | H01L 29/7848 |
| | | | 257/192 |
| 2015/0333086 A1 | 11/2015 | Liu et al. | |
| 2016/0197072 A1 | 7/2016 | Liu et al. | |
| 2016/0268399 A1 | 9/2016 | Akarvardar et al. | |
| 2016/0351566 A1 | 12/2016 | Niimi et al. | |
| 2016/0351591 A1* | 12/2016 | Xie | H01L 27/1211 |

* cited by examiner

US 9,842,933 B1

FORMATION OF BOTTOM JUNCTION IN VERTICAL FET DEVICES

TECHNICAL FIELD

The present disclosure relates generally to methods for fabricating semiconductor devices, and more particularly, to formation of a bottom junction such as a bottom source or a bottom drain in vertical FET devices.

BACKGROUND OF THE DISCLOSURE

Conventional FinFET transistor structures, also known as lateral FinFETs, have been developed as an alternative to the planar bulk-silicon (bulk-Si) MOSFET structure for improved scalability. FinFETs utilize a Si fin rather than a planar Si surface as the channel/body. A gate electrode straddles the fin. The fin width is the effective body thickness. In the on state, current flows horizontally through the fin from a source to a drain disposed along gated sidewall surfaces of the fin.

In vertical FETs, a source and a drain are disposed on the top and the bottom boundaries of the fin or body. A gate is disposed on either side or all around the fin or the body. In a vertical FET, current flows from the source to the drain vertically through the fin/channel.

SUMMARY OF THE DISCLOSURE

The shortcomings of the prior art are overcome and additional advantages are provided through the provision, in one embodiment, of a method which includes, for instance, providing an intermediate semiconductor structure having a semiconductor substrate, a fin disposed on the semiconductor substrate, the fin having a top surface, and spaced-apart vertical sides, a mask disposed over the top surface of the fin, and at least one spacer disposed over the vertical sides of the fin, removing portions of the substrate to define spaced-apart recesses each extending below a respective one of the spacers, and growing semiconductor material in the recesses.

In another embodiment, a semiconductor structure includes, for example, a semiconductor substrate, a fin disposed on said semiconductor substrate, the fin having a top surface and substantially vertical sides, and spaced-apart epitaxially grown semiconductor material disposed below a respective one of the vertical sides of said fin.

Additional features and advantages are realized through the techniques of the present disclosure. Other embodiments of the present disclosure are described in detail herein and are considered a part of the claims.

BRIEF DESCRIPTION OF THE DRAWINGS

The subject matter of the present disclosure is particularly pointed out and distinctly claimed in the concluding portion of the specification. The disclosure, however, may best be understood by reference to the following detailed description of various embodiments and the accompanying drawings in which:

DETAILED DESCRIPTION OF THE DISCLOSURE

The present disclosure and certain features, advantages, and details thereof, are explained more fully below with reference to the non-limiting embodiments illustrated in the accompanying drawings. Descriptions of well-known materials, fabrication tools, processing techniques, etc., are omitted so as to not unnecessarily obscure the disclosure in detail. It should be understood, however, that the detailed description and the specific examples, while indicating embodiments of the present disclosure, are given by way of illustration only, and are not by way of limitation. Various substitutions, modifications, additions and/or arrangements within the spirit and/or scope of the underlying concepts will be apparent to those skilled in the art from this disclosure. Reference is made below to the drawings, which are not drawn to scale for ease of understanding, wherein the same reference numbers used throughout different figures designate the same or similar components.

FIGS. 1-8 diagrammatically illustrate a method for forming a bottom junction such as a bottom source or a bottom drain in vertical FET devices according to an embodiment of the present disclosure.

Figure 1:
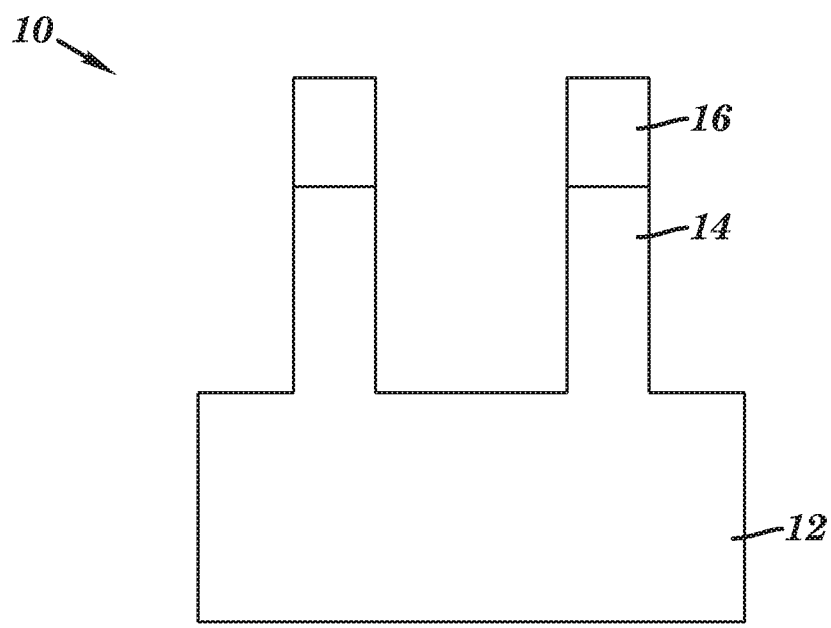
FIGS. 1-8 diagrammatically illustrate a method for forming a bottom junction such as a bottom source or a bottom drain in vertical FET devices according to an embodiment of the present disclosure.

Initially, with reference to FIG. 1, a beginning intermediate structure 10 includes a substrate 12 and a plurality of fins 14 formed using a patterned hard mask 16. Substrate 12 and fins 14 can be formed from silicon or any semiconductor material including, but not limited to, silicon (Si), germanium (Ge), a compound semiconductor material, a layered semiconductor material, a silicon-on-insulator (SOI) material, a SiGe-on-insulator (SGOI) material, and/or a germanium-on-insulator (GOI) material, or other suitable semiconductor material or materials. Fins 14 may be formed using conventional lithography and etching techniques. As one skilled in the art will understand, where, as in the present example, a semiconductor material is used, many fins may be formed, such that what is shown in FIG. 1 is repeated a large number of times across the substrate such as a wafer.

Figure 2:
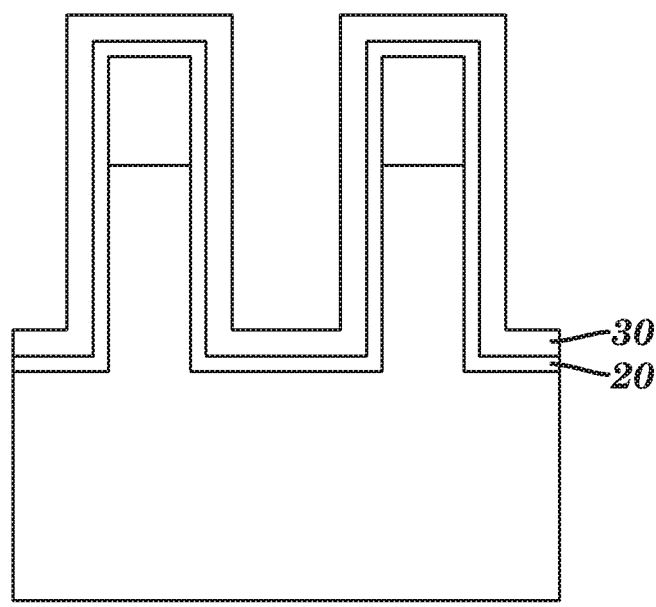
Figure 3:
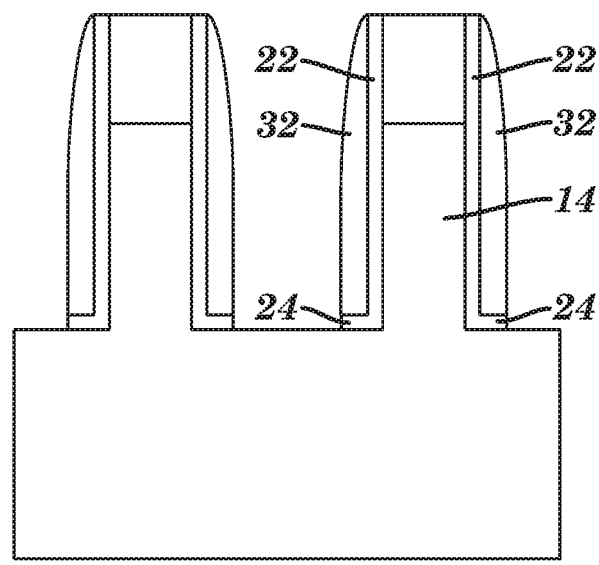

As shown in FIG. 2, a first sacrificial layer 20 such as an oxide layer is disposed over intermediate structure 10, and a second sacrificial layer 30 such as a nitride layer is disposed over the oxide layer. A removal process such as a reactive ion etching (ME) process is performed on first sacrificial layer 20 and second sacrificial layer 30 to form sacrificial spacers 22 and 32 on the sidewalls of fins 14 as shown in FIG. 3. In this embodiment, spacers 22 and 32 extend along the sides of fins 14 and hard mask 16. A lower portion 24 of spacer 22 extends under spacer 32.

Figure 4:
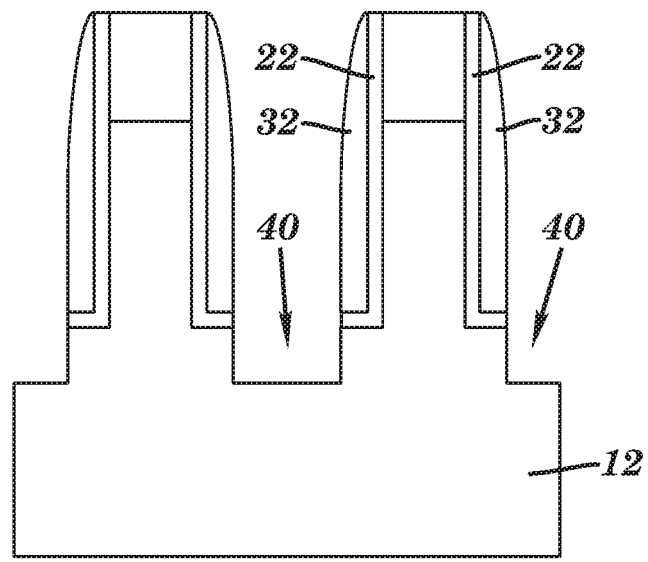

With reference to FIG. 4, a removal process such as a substrate etch is performed to define recesses 40 in substrate 12 between spacers 22 and 32, and below the bottom of the fins. For example, a removal process may be an anisotropic etch such as an anisotropic dry etch that vertically etches into substrate 12 to form recesses 40.

Figure 5:
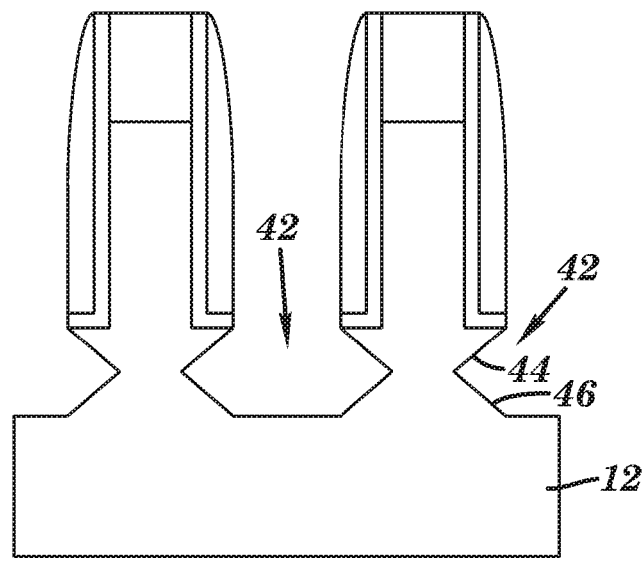

As shown in FIG. 5, a further substrate etch may be performed in substrate 12 to enlarge recesses 40 (FIG. 4).

For example, a wet, dry, or wet and dry etch may be an isotropic etch that further etches substrate 12 to enlarge recess 40 (FIG. 4) in all directions such as downward into substrate 12 and under spacers 30, spacer 32, and portions of fin 14 to define enlarged recesses 42. For example, the further substrate etch may be an HCl etch. The shape of enlarged recess 42 may have angled or tapering surfaces 44 and 46 that angle or taper toward each other in the direction toward the middle of the fin. It will be appreciated that the enlarged recesses may have any suitable shape that extends under the spacer and/or under portions of the fins. For example, various etching steps may be employed to tailor a desired shape of the enlarged recess that extends under the spacer and/or under portions of the fins.

Figure 6:
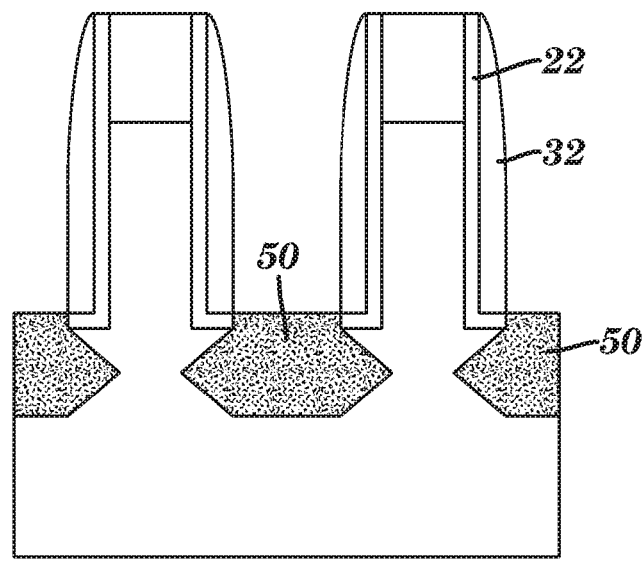
Figure 7:
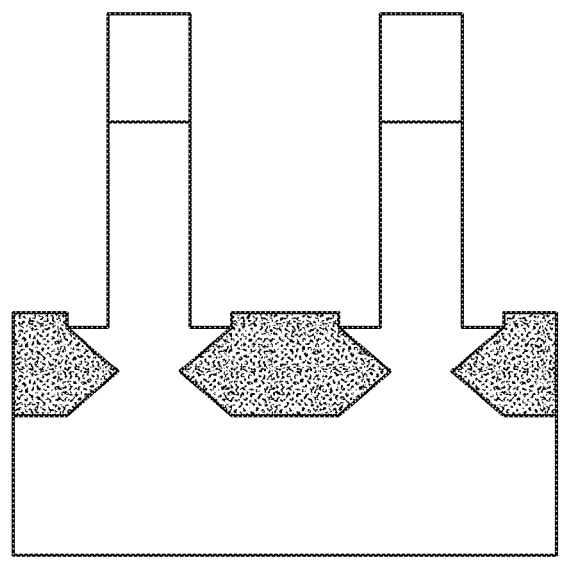

In FIG. 6, a bottom junction 50 such as a source or a drain is disposed in the enlarged recesses. For example, an epitaxial semiconductor material may be grown in the enlarged recesses. Thereafter, spacers 22 and 32 may be removed as shown in FIG. 7.

Figure 8:
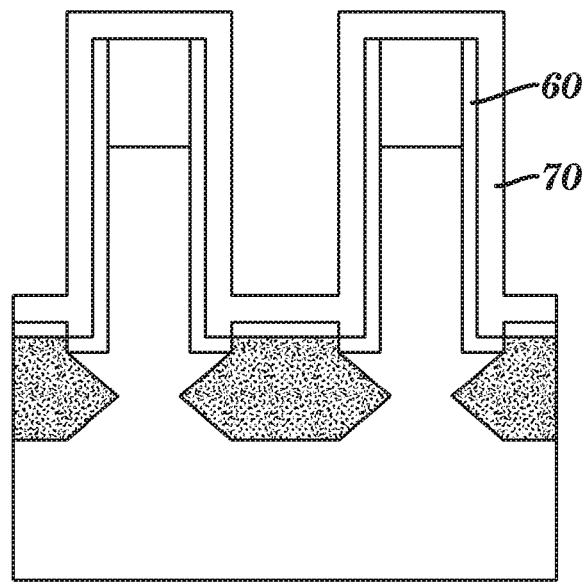

As shown in FIG. 8, a dielectric layer 60 such as an interfacial and a high-k layer may be disposed over the fins, the hard mask, and the bottom junction. A metal gate 70 may then be formed over layer 60. The in-situ doped selective epitaxy is operable to form an N+ or a P+ bottom plate which may merge together by diffusion so that it forms a quasi uniform region.

FIGS. 9-13 diagrammatically illustrate a method for forming a bottom junction such as a bottom source or a bottom drain in vertical FET devices according to an embodiment of the present disclosure. For example, this embodiment may result in the bottom junction having a different configuration compared to the configuration of the bottom junction shown in FIG. 6.

Figure 9:
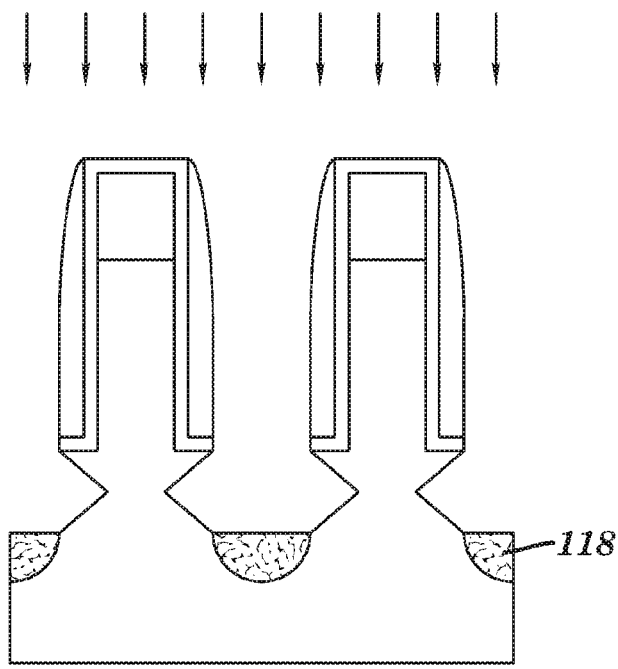
FIGS. 9-13 diagrammatically illustrate a method for forming a bottom junction such as a bottom source or a bottom drain in vertical FET devices according to an embodiment of the present disclosure.
Figure 10:
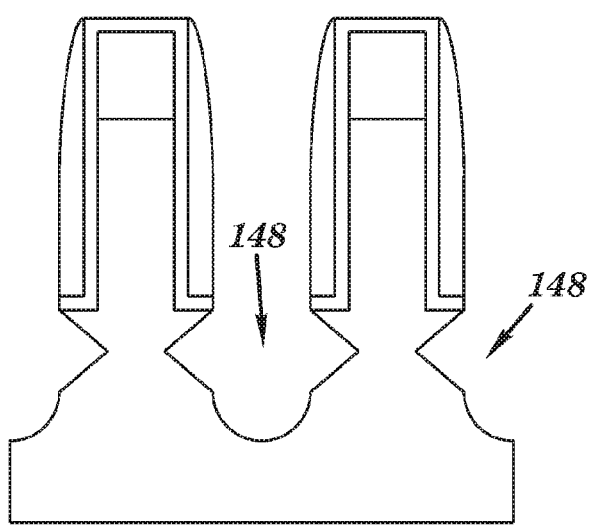

With reference to FIG. 9, a further removal process of the intermediate semiconductor structure of FIG. 6 may include an amorphization implantation process that converts a portion of the crystalline substrate into an amorphous portion 118. Thereafter, portions 118 of the substrate may be removed, as shown in FIG. 10, to form enlarged recess 148. For example, a suitable removal process may be an etch process.

Figure 11:
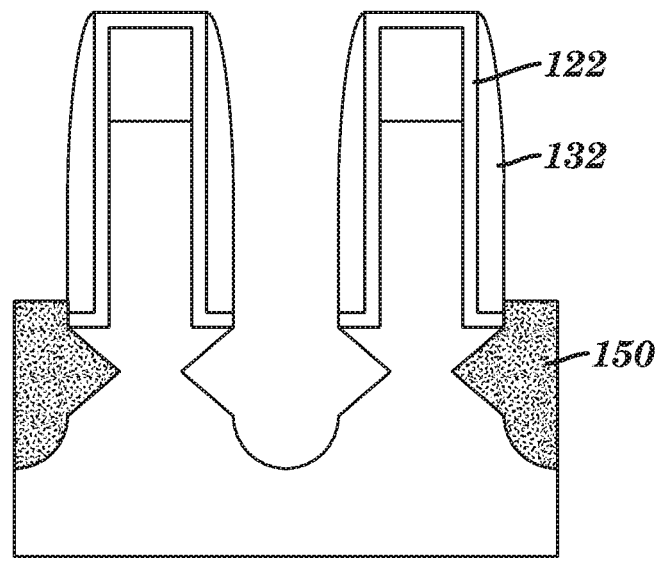
Figure 12:
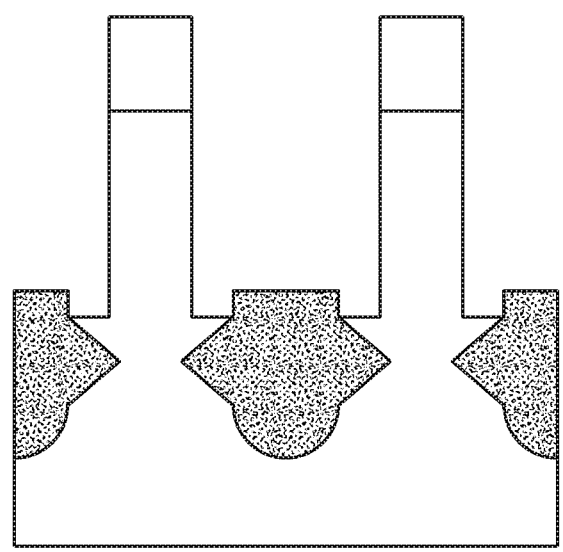

In FIG. 11, a bottom junction 150 such as a source or drain is disposed in the enlarged recesses. For example, an epitaxial semiconductor material may be grown in the enlarged recesses. Thereafter, spacers 122 (FIG. 11) and 132 (FIG. 11) may be removed as shown in FIG. 12.

Figure 13:
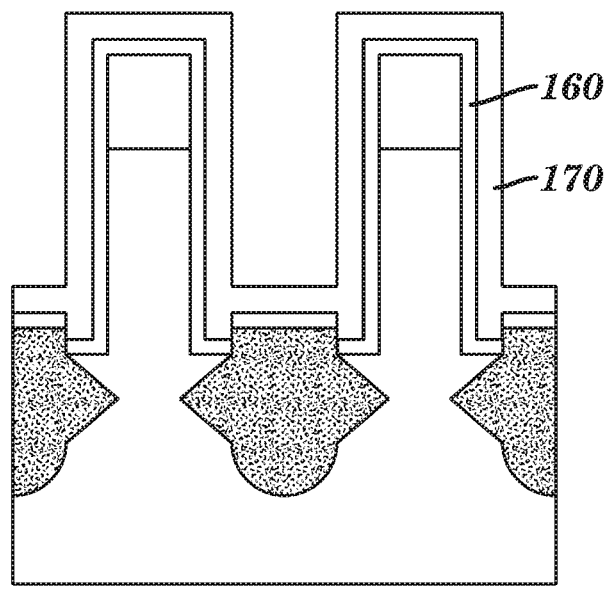

As shown in FIG. 13, a dielectric layer 160 such as an interfacial and a high-k layer may be disposed over the fins, the hard mask, and the bottom junction. A metal gate 170 may then be formed over layer 160. The in-situ doped selective epitaxy is operable to form an N+ or a P+ bottom plate which may merge together by diffusion so that it forms a quasi uniform region.

FIGS. 14-18 diagrammatically illustrate a method for forming a bottom junction and a top junction such as in vertical FET devices according to an embodiment of the present disclosure.

Figure 14:
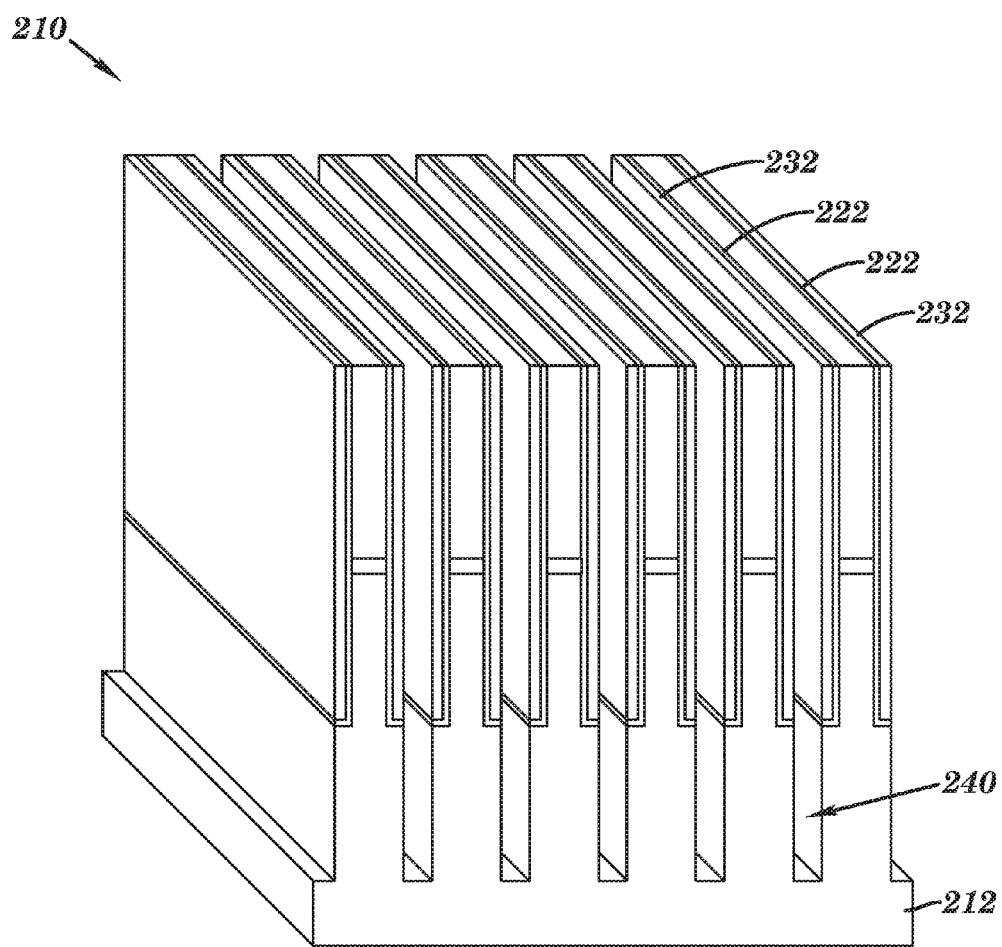
FIGS. 14-18 diagrammatically illustrate a method for forming a bottom junction and a top junction such as in vertical FET devices according to an embodiment of the present disclosure.

For example, FIG. 14 illustrates an intermediate semiconductor structure 210 formed similarly as the intermediate semiconductor structure of FIG. 4 as described above. A removal process such as a substrate etch may be performed to define recesses 240 in substrate 212 between spacers 222 and 232, and below the bottom of the fins. For example, a removal process may be an anisotropic etch such as an anisotropic dry etch that vertically etches into substrate 212 to form recesses 240. The removal process may etch into the substrate about 30 nanometers.

Figure 15:
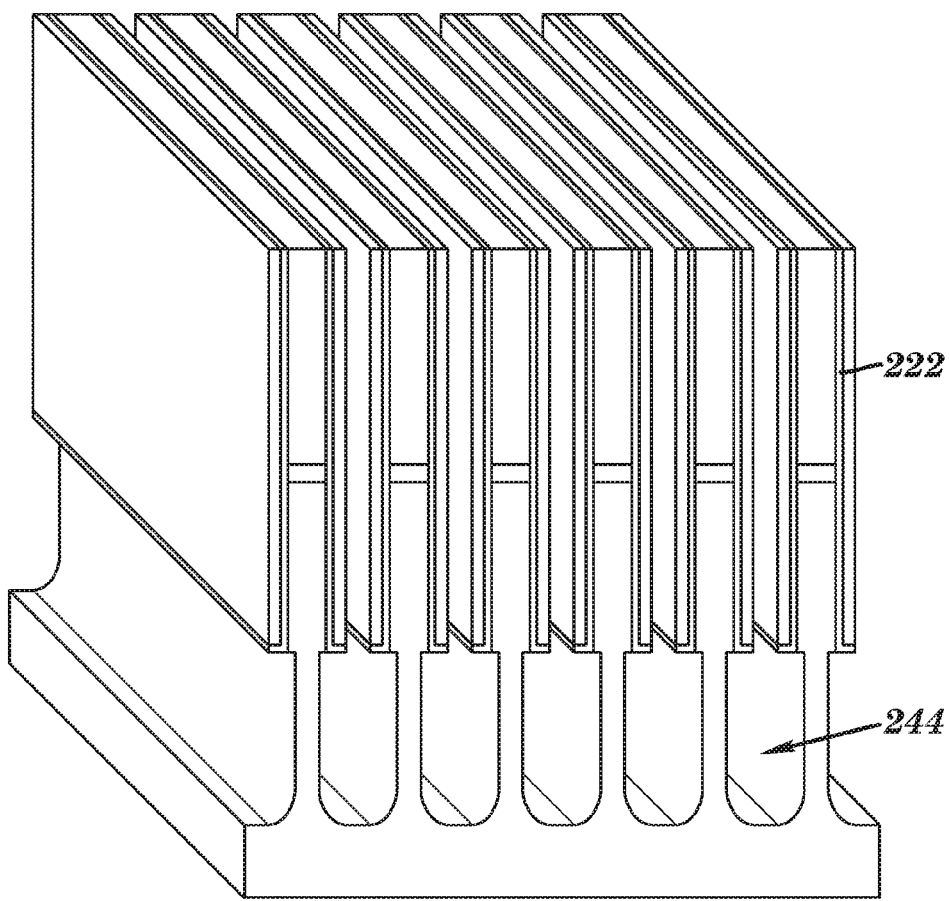

As shown in FIG. 15, a silicon isotropic etch may result in enlarged recesses 244. For example, portions of the substrate directly under the spacers may be removed. In this illustrated embodiment, about 4 nanometer strips or portions may be removed per side. Enlarged recesses 244 may include the removal of the substrate under spacer 222, and may also include removal of the substrate under the fin.

Figure 16:
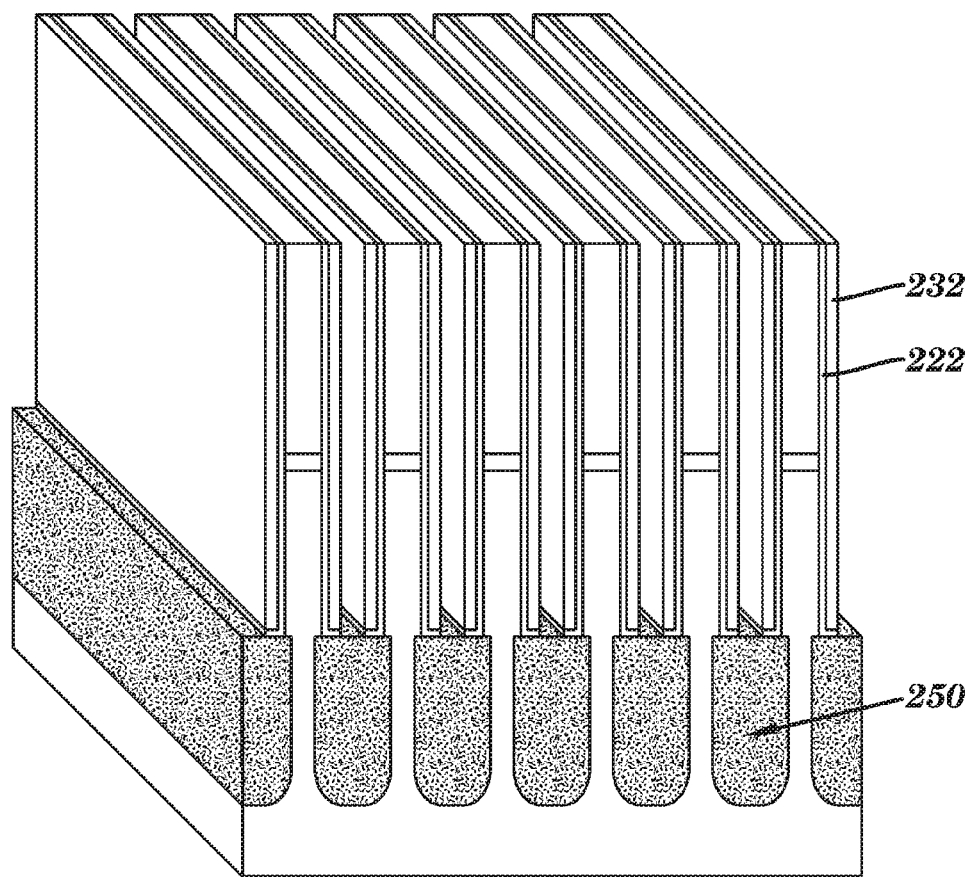
Figure 17:
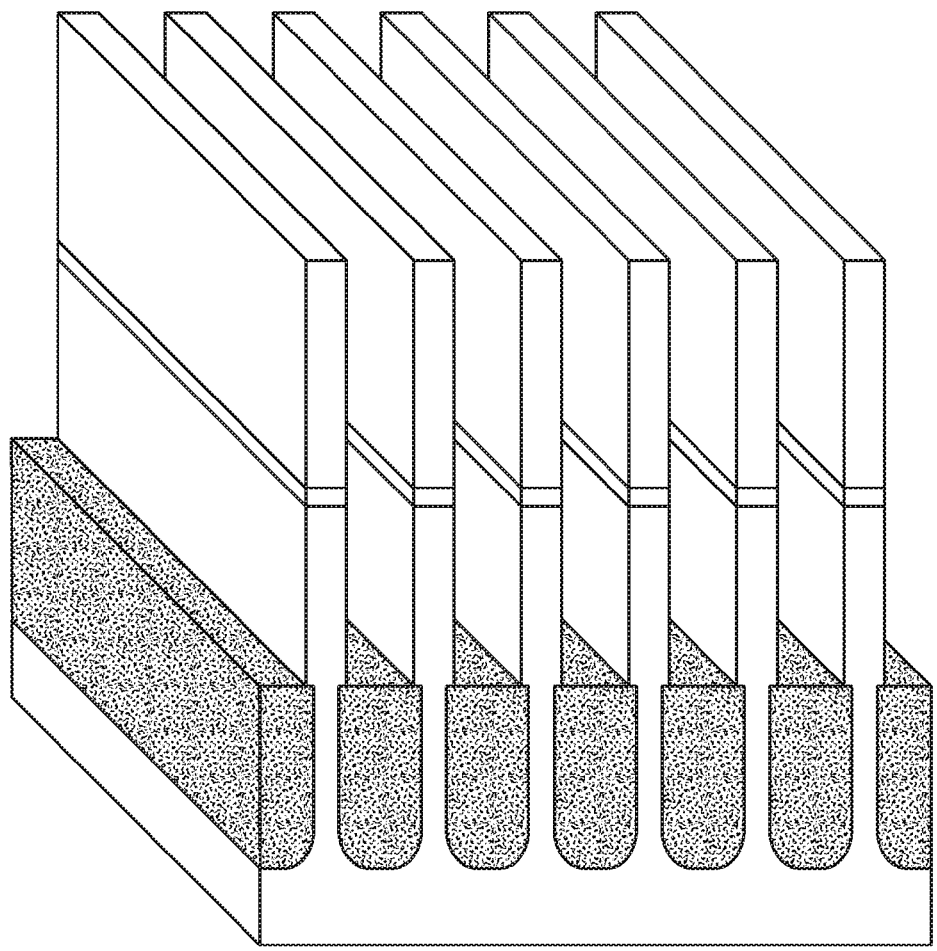

In FIG. 16, a bottom junction 250 such as a source or a drain may be disposed in the enlarged recesses. For example, an epitaxial semiconductor material may be grown in the enlarged recesses. An in-situ doped selective epitaxy is operable to form an N+ or a P+ bottom plate. Thereafter, spacers 222 (FIG. 16) and 232 (FIG. 17) may be removed as shown in FIG. 17. Total process flow thermal budget may drive dopants into the remaining undoped silicon/substrate pillar under the fin, by diffusion, to complete the bottom plate and may achieve a uniform junction with the channel along all of the fin length. The silicon/substrate pillar under the fin may be relatively narrow about 5 nanometers. This 5 nanometer gap may be easy to fill with dopants by diffusion. By design and as expected, dopants may also diffuse up closer to the channel to form the junction with the channel (similarly this principle applies for top plate/drain, for example, as shown in FIG. 18).

Figure 18:
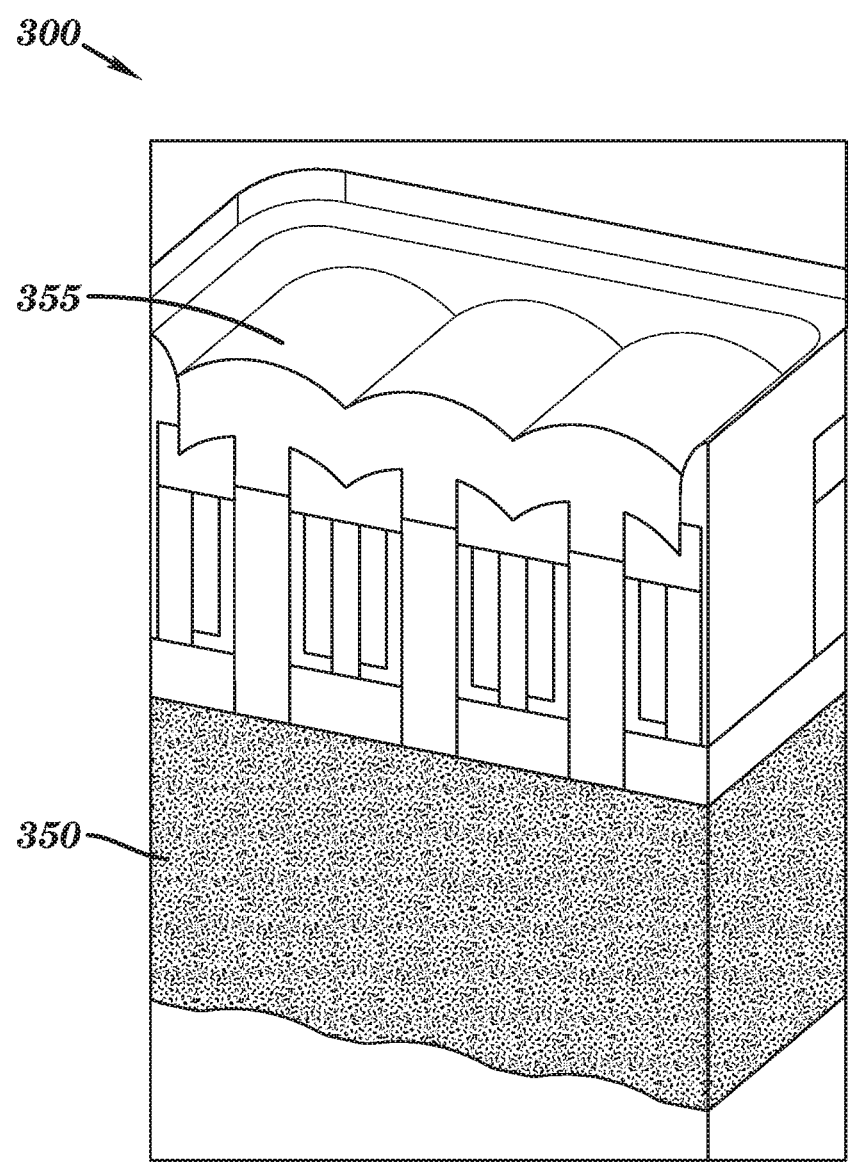

FIG. 18 is a perspective cross-sectional view of a vertical FET 300 according to an embodiment of the present disclosure formed from the intermediate structure of FIG. 17. In this embodiment, vertical FET 300 includes a source 350 and a drain 355. It will be appreciated that the bottom junction may be a drain and the upper junction may be a source. The in-situ doped selective epitaxy is operable to form an N+ or a P+ bottom plate which may merge together by diffusion so that it forms a quasi uniform region 350.

Figure 19:
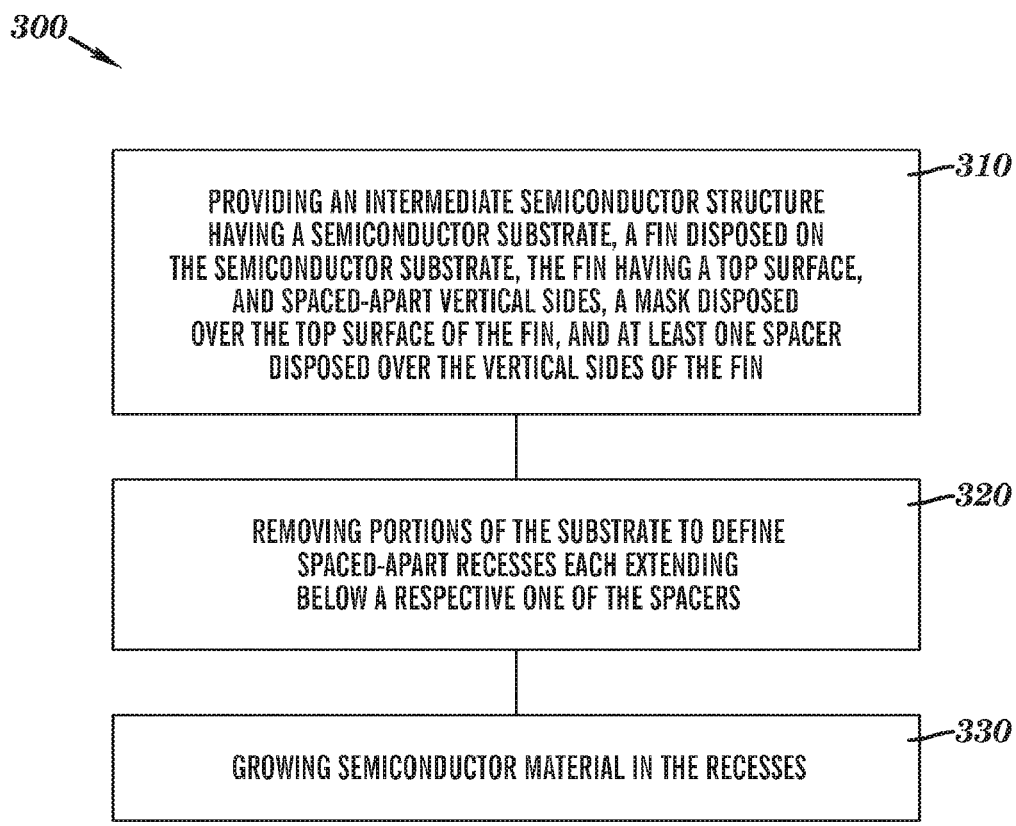
FIG. 19 is a flowchart illustrating a method for use in forming a vertical FET according to an embodiment of the present disclosure.

FIG. 19 is a flowchart of a method 300 for forming an intermediate semiconductor structure according to an embodiment of the present disclosure. The method includes at 310 providing an intermediate semiconductor structure having a semiconductor substrate, a fin disposed on the semiconductor substrate, the fin having a top surface, and spaced-apart vertical sides, a mask disposed over the top surface of the fin, and at least one spacer disposed over the vertical sides of the fin. At 320, portions of the substrate are removed to define spaced-apart recesses each extending below a respective one of the spacers, and at 330 semiconductor material is grown in the recesses.

The processing according to the present disclosure may be operable to form of intermediate semiconductor structures having fin pitch as low as 20 nanometers or lower, and fin width as low as 5 nanometers. For example, a fin pitch and fin width may be 20 manometers and 8 nanometers, respectively. The sacrificial layers/spacers may be a 1.5 nanometers oxide deposition and a 3 nanometers nitride deposition. The nitride deposition may be thinner than 3 nanometers. The oxide layer may not be necessary.

Conventional patterning may be employed for separately forming NFET and PFET areas. For example, a suitable pattern may protect or cover a PFET area during spacer anisotropic etch. Spacers formed may only be needed in NFET area for silicon/substrate exposure between fins in NFET area.

The technique of the present disclosure may result in a total process flow thermal budget that may drive dopants into the remaining undoped silicon/substrate pillar under the fin, by diffusion, to complete the bottom plate and achieve a uniform junction with the channel along all the fin length. The silicon/substrate pillar under the fin may be relatively narrow about 5 nanometers. The 5 nanometer gap may be easily filled with dopants by diffusion. Also, by design and as is expected, dopants may also diffuse up closer to the channel to form the junction with channel (the same principle may apply for top plate/drain). The present disclosure may result in achieving self-aligned bottom plate doping with best dopants position control for device design, dopants activation (epi) to achieve low access resistance, controlling bottom junction position to optimize device performance and limit variability, avoiding dopants in channel, and provide a little impact on fin profile. The present disclosure for forming vertical FETs, is also potentially applicable to vertical FETs in general including nanowires, nanosheets, tunneling FETs, etc. The vertical Fin FET may be applicable 3 nanometers node and beyond.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the present disclosure and the practical application, and to enable others of ordinary skill in the art to understand the disclosure for various embodiments with various modifications as are suited to the particular use contemplated.

The invention claimed is:

1. A method for use in forming a vertical FinFET device, the method comprising:
   providing an intermediate semiconductor structure comprising:
      a semiconductor substrate;
      a fin disposed on the semiconductor substrate, the fin having a top surface, and spaced-apart vertical sides;
      a mask disposed over the top surface of the fin; and
      at least one spacer disposed over the vertical sides of the fin;
   removing portions of the substrate to define spaced-apart recesses each extending below a respective one of the spacers;
   growing semiconductor material in the recesses for a source or a drain for a bottom junction in the vertical FinFET device;
   forming a gate structure adjacent to at least the vertical sides of the fin; and
   forming, above the top of the fin, the other of the source or the drain for a top junction in the vertical FinFET device.

2. The method of claim 1 wherein the removing comprises removing portions of the substrate beneath the spacers and beneath a portion of the fin to define the spaced-apart recesses, and wherein the growing comprises growing the semiconductor material in the spaced-apart recesses beneath the spacers and beneath the portion of the fin.

3. The method of claim 1 wherein growing comprises epitaxially growing semiconductor material in the recesses.

4. The method of claim 1 wherein the removing comprises first removing vertical portions of the substrate adjacent to and below the spacers, and second removing portions of the substrate perpendicularly under the spacers to define the recesses.

5. The method of claim 1 wherein the recesses comprise tapering surfaces disposed under portions of the fin.

6. The method of claim 1 wherein the at least one spacer comprises a first and a second spacer, and wherein the first spacer extends under the second spacer.

7. The method of claim 1 wherein the removing comprises isotropically removing the portions of the substrate.

8. The method of claim 1 wherein the removing comprises isotropically removing portions of the substrate to define the recesses extending beneath the spacers and beneath at least a portion of the fin.

9. The method of claim 1 wherein the removing comprises anisotropically removing portions of the substrate.

10. The method of claim 1 wherein the removing comprises anisotropically removing portions of the substrate extending below the spacers, and isotropically removing portions of the substrate so that the recesses extend beneath the spacers and beneath the fin.

11. The method of claim 1 wherein the removing comprises isotropically removing portions of the substrate, and anisotropically removing portions of the substrate so that the recesses extend beneath the spacers and beneath the fin.

12. The method of claim 1 further comprising implanting in the semiconductor substrate adjacent to the recesses an implant material resulting in amorpharizing of the substrate adjacent to the recesses, removing the amorphous substrate portions to define enlarged recesses, and wherein the growing comprises growing the semiconductor material in the enlarged recesses.

13. The method of claim 1 further comprising removing the at least one spacer and forming a dielectric layer over the fin prior to forming the gate.

14. The method of claim 13 wherein the vertical FET device is a gate-all around device.

* * * * *